(12) United States Patent
Winkler et al.

(10) Patent No.: US 6,947,875 B2
(45) Date of Patent: Sep. 20, 2005

(54) APPARATUS AND METHODS FOR VIRTUAL ACCOMMODATION

(75) Inventors: Edward R. Winkler, St. Peters, MO (US); Landon C. Onyebueke, Nashville, TN (US)

(73) Assignee: The Boeing Company, Chicago, IL (US)

( * ) Notice: Subject to any disclaimer, the term of this patent is extended or adjusted under 35 U.S.C. 154(b) by 822 days.

(21) Appl. No.: 09/908,904

(22) Filed: Jul. 18, 2001

(65) Prior Publication Data

US 2003/0018454 A1 Jan. 23, 2003

(51) Int. Cl.$^7$ ............................................. G06F 17/50
(52) U.S. Cl. .................... 703/1; 703/6; 703/8; 702/179
(58) Field of Search ................................ 703/1–2, 6–8; 345/650–653; 702/179

(56) References Cited

U.S. PATENT DOCUMENTS

| 6,073,885 | A | * | 6/2000 | Winkler .................... 244/137.2 |
| 6,113,644 | A | * | 9/2000 | Weber et al. ................... 703/8 |
| 6,597,369 | B2 | * | 7/2003 | Mochimaru et al. ........ 345/647 |

FOREIGN PATENT DOCUMENTS

GB           2175729 A   * 12/1986   ........... G09B/23/00

OTHER PUBLICATIONS

Fairbank, "One–Size–Fits–All Cockpit Challenges JSF's Engineers," Seattle Time, p. C.4 (Jul. 5, 2000).*
Anonymous, "Digital People Help Company Lower Airfare," Computer–Aided Engineering, vol. 18, No. 2, p. 11 (Feb. 1999).*
Badler, "Virtual Humans for Animation, Ergonomics, and Simulation," IEEE Proceedings of the Nonrigid and Articulated Motion Workshop, pp. 28–36 (Jun. 1997).*
Development of a PC Based Expanded Accommodation Analysis Technique for the Design of a Crew Station Cockpit, Onyebueke et al., EDA 2000 Conference, 6 Pages, Jul. 30, 2000.

* cited by examiner

*Primary Examiner*—Samuel Broda
(74) *Attorney, Agent, or Firm*—Harness Dickey & Pierce P.L.C.

(57) ABSTRACT

A system for developing a design of an environment such as an aircraft cockpit. A processor generates body models describing a percentage of a body population potentially to be accommodated by the environment. A processor-user interface displays an environment design relative to the body models. The interface accepts user changes to the design and the body models. The processor modifies the design and the body models in accordance with user changes. The system allows a designer of an airplane cockpit to rapidly visualize, analyze and assess its accommodation of a desired percentage of pilots.

24 Claims, 7 Drawing Sheets

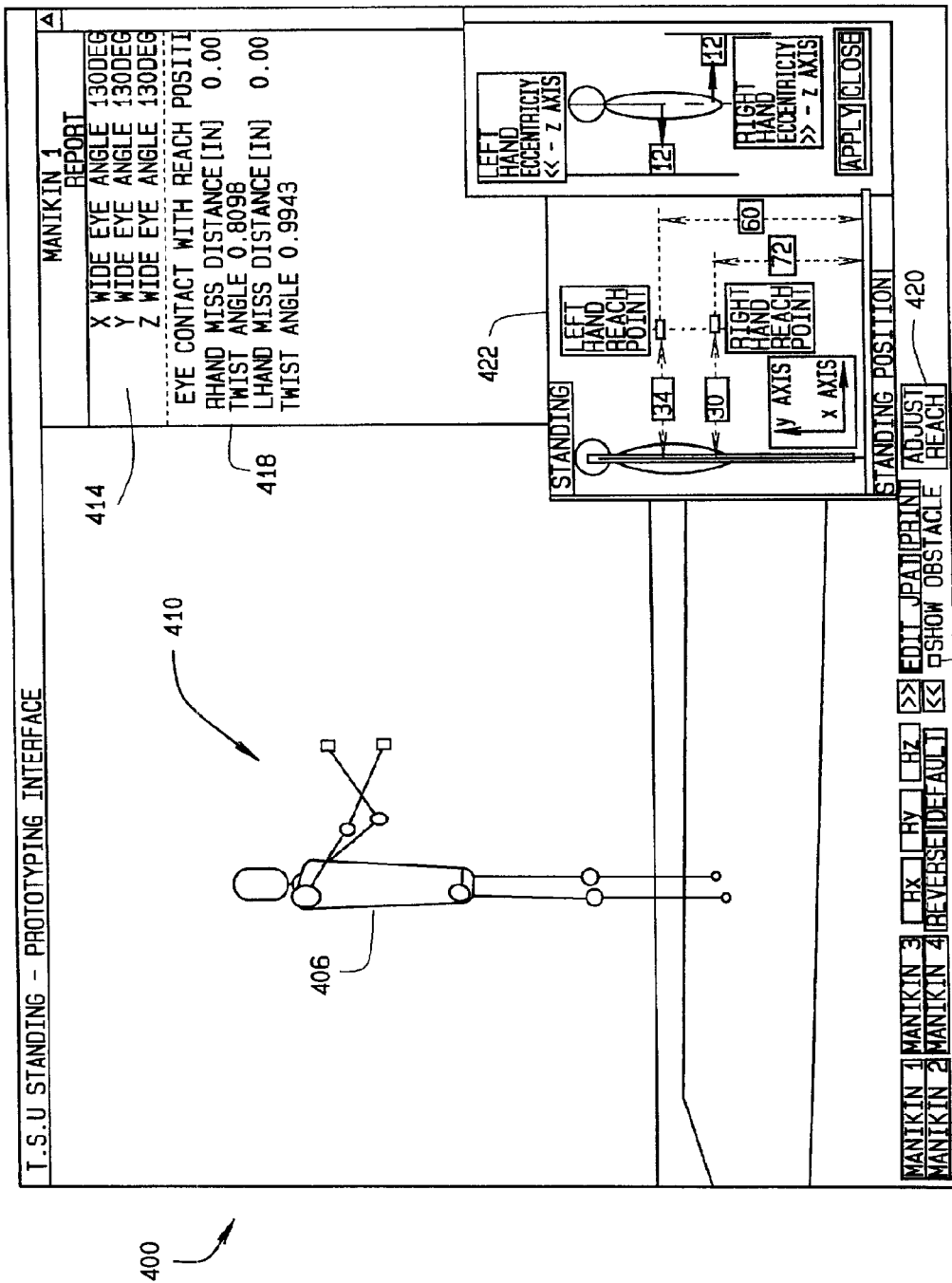

APPARATUS AND METHODS FOR VIRTUAL ACCOMMODATION

COPYRIGHT NOTICE

A portion of the disclosure of this patent document contains material that is subject to copyright protection. The copyright owner has no objection to the facsimile reproduction by anyone of the patent disclosure, as it appears in the U.S. Patent and Trademark Office patent files or records, but otherwise the copyright owner reserves all copyright rights whatsoever.

FIELD OF THE INVENTION

The present invention relates generally to automated design systems and, more particularly, to a system for developing a design of an environment for physically accommodating at least one body such as a human body.

BACKGROUND OF THE INVENTION

An aircraft cockpit typically must accommodate pilots who can vary widely from one another in size and body structure. Differences in pilots' bodily dimensions can make it difficult to design a cockpit that accommodates all pilots in all cockpit areas. For example, for military aircraft, it can be difficult to design a cockpit that provides adequate access by smaller pilots to aircraft controls without compromising an ejection clearance provided for larger pilots. A cockpit design must also provide adequate seat elevation for shorter pilots so that they have visual access to a head up display (HUD) eye box.

Traditionally, cockpits have been designed based on estimates of fit by the pilot population within a number of percentile ranges, e.g. between third and ninety-eighth percentiles, calculated for a number of bodily dimensions. Percentiles, however, are univariate (one-variable) statistics. The percentile approach has failed to account for pilots having varying combinations of anthropometric dimensions, for example, having long legs in combination with a short torso. Additionally, accommodation analysis, regardless of the statistical method used, entails numerous calculations that are complex and time consuming.

It would be desirable to provide an interactive system that allows a designer to display a cockpit design, evaluate quickly and automatically whether the design accommodates a desired percentage of pilots, and modify the design accordingly to achieve the desired percentage accommodation. Moreover, it would be desirable to provide such a system that would be adaptable for use by designers of other environments and body-accommodating systems such as automobile passenger compartments, work areas and sporting equipment.

SUMMARY OF THE INVENTION

In one preferred form, the present invention provides a system for developing a design of an environment for accommodating at least one body such as a human body. The system includes a processor configured to generate a plurality of body models describing a percentage of a population of bodies potentially to be accommodated by the environment design. The system also includes a processor-user interface, in which an environment design is graphically displayed relative to at least one of the body models. The interface is configured to accept from a user changes to the environment design and the body models. The processor is further configured to modify the design and the body models in accordance with the user changes.

The above system can be adapted for use in the design of a wide variety of environments, including but not limited to airplane cockpits, single and multiple automobile and truck passenger compartments, heavy machinery, aircraft passenger compartments and work environments. The system allows a designer of, for example, an airplane cockpit to rapidly visualize, analyze and assess its accommodation of a desired percentage of pilots. The designer can quickly analyze how a given design accommodates various populations. Furthermore, the graphic display allows the designer to demonstrate specific tradeoffs between one design and another relative to accommodation.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 12 is an illustration of a frame displaying a work environment.

DETAILED DESCRIPTION OF THE PREFERRED EMBODIMENTS

The following description of the preferred embodiments is merely exemplary in nature and is in no way intended to limit the invention, its application, or uses. As described below, the present invention in one embodiment is directed to a system for developing a design of an environment for accommodating at least one body such as a human body. The environment could include, for example, an aircraft cockpit, automobile passenger compartment, or an area in which an aircraft maintainer or a mechanic is working. Generally, the invention can be practiced in connection with designing any environment having features, such as protrusions or surfaces, which are to be located relative to a body or bodies to be accommodated by the environment. Such environments include body-accommodating systems, for example, sporting equipment. Environments and systems for accommodating animals, for example, trailers and holding areas, also could be designed according to the principles of the invention.

Figure 1:
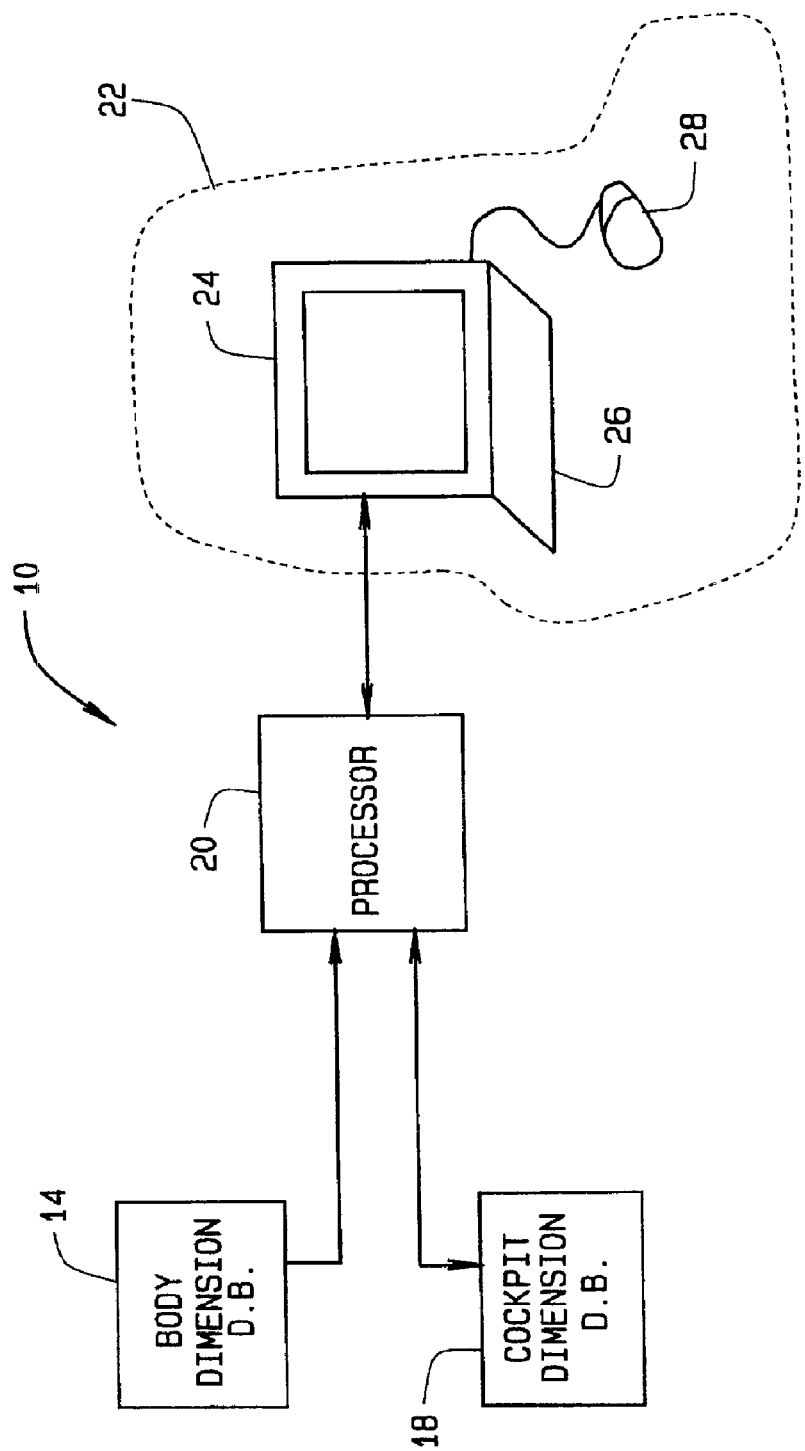
FIG. 1 is a diagram of a system in accordance with a preferred embodiment of the present invention for developing a design of an environment for accommodating at least one body.

A preferred embodiment of a system for developing a design of an environment for accommodating at least one body is generally indicated by reference number 10 in FIG. 1. A body dimension database 14 includes dimensions of a plurality of bodies potentially to be accommodated by the environment, which in the present exemplary embodiment is an aircraft cockpit. Thus the database 14 includes, for example, data describing bodily dimensions of a population anticipated to pilot the plane in which the cockpit is to be built. Such bodily dimensions include, for example, thumb tip reach, sitting height, buttock knee length, and the like. One such database has been compiled in connection with the Joint Primary Aircraft Training System ("JPATS") of the United States Department of Defense. A database 18 includes dimensions for at least one cockpit design. The term "dimensions" as used herein should not be interpreted to include only linear dimensions. The databases 14 and/or 18 can include other data, for example, angles and weight, that could be used in describing a two- or three-dimensional object or space.

The databases 14 and 18 are accessible by a processor 20, which may be a computer, microcomputer, microprocessor, controller, microcontroller, or the like. The processor 20 is connected to a processor-user interface 22 including a display 24 accessible by a user using, for example, a keyboard 26 and a mouse or mouse pad 28. It is possible, of course, for the databases 14 and 18 to reside on the processor 20, which in one embodiment is a component of a laptop computer.

Generally, and as further described below, the processor 20 generates a plurality of body models or manikins describing a percentage of the pilot population whose dimensions are included in the body dimension database 14. The processor-user interface 22 graphically displays a design for the cockpit relative to at least one of the manikins and accepts from the user changes to the design and/or to the manikin(s). The processor 20 modifies the design and/or the manikin(s) in accordance with the user changes. The interface 22 includes a plurality of frames via which the user can design a cockpit to accommodate a desired percentage of the pilot population as further described below. Embodiments of the present invention can be implemented, for example, in Microsoft Visual Basic.

Figure 2:
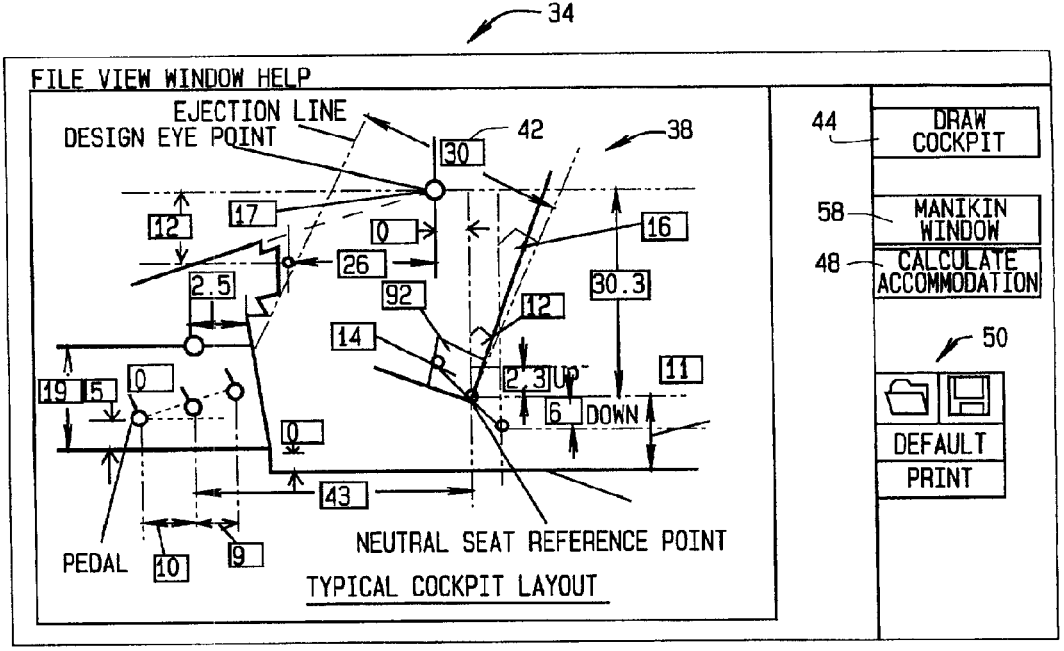
FIG. 2 is an illustration of a cockpit dimension input frame.

FIG. 2 illustrates a cockpit dimension input frame 34 displaying a typical cockpit layout or design 38. Cockpit dimensions, which may be retrieved from the database 18, are shown in blocks 42. The user can use the mouse 28 and keyboard 26 (shown in FIG. 1) to change one or more values in the blocks 42 to change the displayed cockpit dimensions. The user alternatively can enter new data into all of the blocks 42 via the user-processor interface 22. The frame 34 also includes a "Draw Cockpit" button 44 and a "Calculate Accommodation" button 48 further described below. A set of buttons 50 enable the user to save the cockpit design data in a desired location, which can include the database 18. A "Manikin Window" button 58, when activated by the user, causes a manikin frame, generally indicated by the reference number 60 in FIG. 3, to be displayed.

Figure 3:
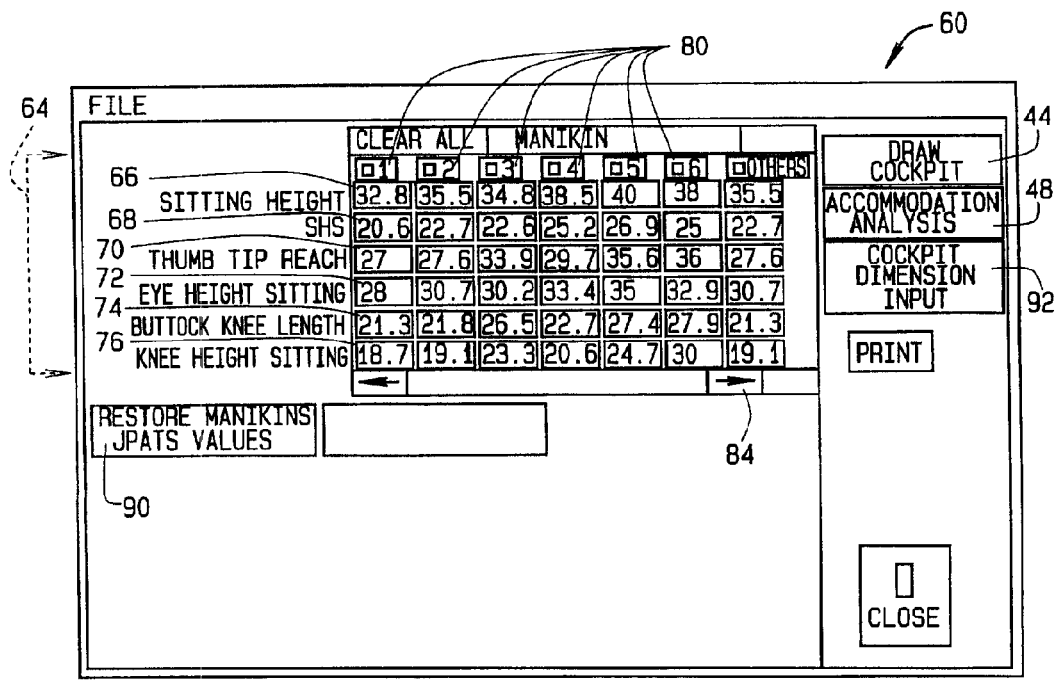
FIG. 3 is an illustration of a manikin frame.

Referring to FIG. 3, the manikin frame 60 displays a plurality of human body dimensions 64 relevant to accommodating a pilot within a cockpit. The dimensions 64 include sitting height 66, mid-shoulder sitting 68, thumb-tip reach 70, eye height sitting 72, buttock-knee length 74, and knee height sitting 76. The types of dimensions may be different, of course, in embodiments for designing environments other than cockpits. As described below, the processor 20 uses data displayed in the manikin frame 60 to generate a display of one or more manikins sitting in the cockpit layout 38 (shown in FIG. 2).

Six sets 80 of the manikin dimensions 64 are shown in FIG. 3. A scroll bar 84 can be used to reveal additional dimension sets 80. In the present embodiment, two additional sets 80 are concealed in FIG. 3. The user can enter dimensions 64 for a ninth manikin dimension set 88, which can be included with the dimension sets 80 in displays and calculations as further described below. The user also can change each of the manikin dimensions 64 via the keyboard 26 and/or mouse 28. A "Restore Manikins" button 90 allows the user to restore a set of default values for the dimension sets 80. These predetermined default values, further described below, are calculated and stored in the processor 20. By activating a "Cockpit Dimension Input" button 92, the user can display the cockpit dimension input frame 34 (shown in FIG. 2). Like the cockpit dimension input frame 34, the manikin frame 60 includes a "Calculate Accommodation" button 48, further described below, and a Draw Cockpit" button 44.

Figure 4:
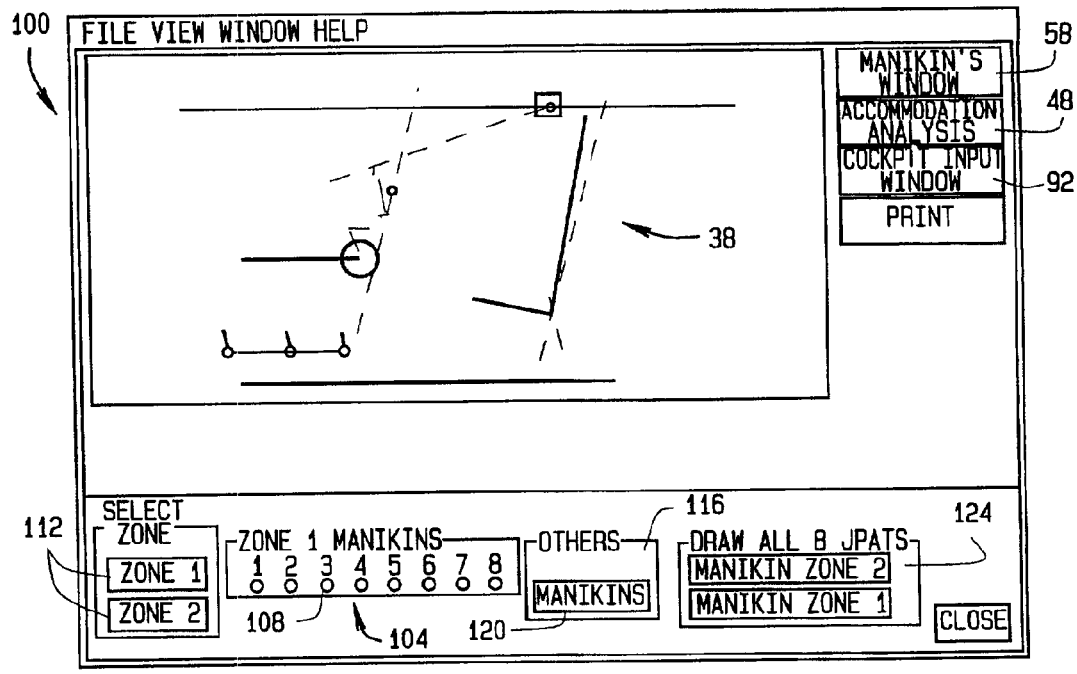
FIG. 4 is an illustration of a draw-cockpit frame.

When the "Draw Cockpit" button 44 is activated, a draw-cockpit frame 100 is displayed as shown in FIG. 4. Although two spatial dimensions are displayed as shown in FIG. 4, enclosures having other dimensions can be displayed in other embodiments. The processor 20 uses cockpit dimensions from the cockpit dimension input frame 34 (shown in FIG. 2) to draw the cockpit layout 38. The draw-cockpit frame 100 includes a set 104 of manikin option buttons 108 corresponding to the sets 80 of manikin dimensions 64 shown in FIG. 3. The user can select one or more of the buttons 108 to display one or more corresponding manikin as further described below.

As shown in FIG. 4, the set 104 of buttons 108 is associated with one of a plurality of zone buttons 112. In the present embodiment, a zone defines a range of movement afforded a pilot in a cockpit. One zone may define the range of motion of a pilot who, for example, is restrained by a parachute harness in the cockpit. Another zone could define the range of motion of a pilot who is not restrained by such equipment. The zone buttons 112 thus allow the user to evaluate a cockpit design with respect to a pilot range of motion as well as with respect to cockpit and pilot dimensions. In other embodiments, other criteria can be similarly included for use in evaluating an environment design. For example, in an embodiment of a system for designing an aircraft maintainer environment as hereinafter described, a design can be evaluated with respect to lift strength criteria as well as with respect to environment and maintainer dimensions.

An "Others" button 116 allows the user to select the manikin dimension set 88 (shown in FIG. 3) entered by the user via the manikin frame 60. A "Manikins" button 120 allows the user to display the manikins one at a time. Buttons 124 allow the user to associate all manikin sets 80 with a zone and to display all of the sets 80 together as manikins, as further described below. Also included in the frame 100 are a "Cockpit Dimension Input" button 92 that, as previously described, causes the cockpit dimension input frame 34 (shown in FIG. 2) to be displayed. The "Manikin Window" button 58, when activated by the user, causes the manikin frame 60 (shown in FIG. 3) to be displayed. When the user activates the "Calculate Accommodation" button 48, an accommodation analysis frame is displayed as further described below.

Figure 5:
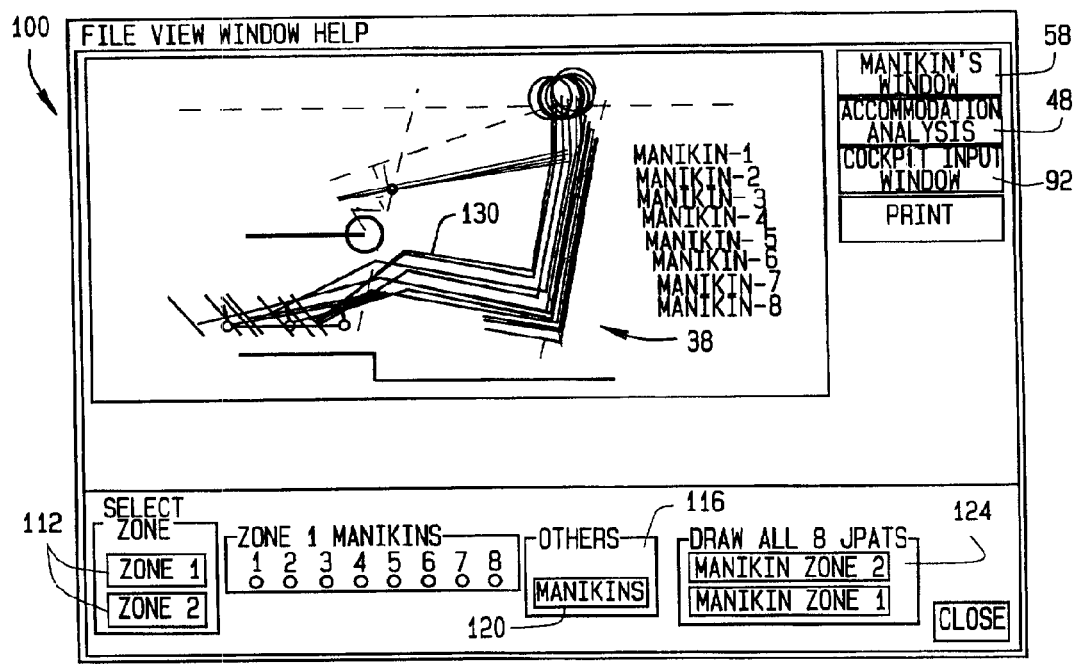
FIG. 5 is an illustration of a draw-cockpit frame in which eight manikins are displayed.
Figure 6:
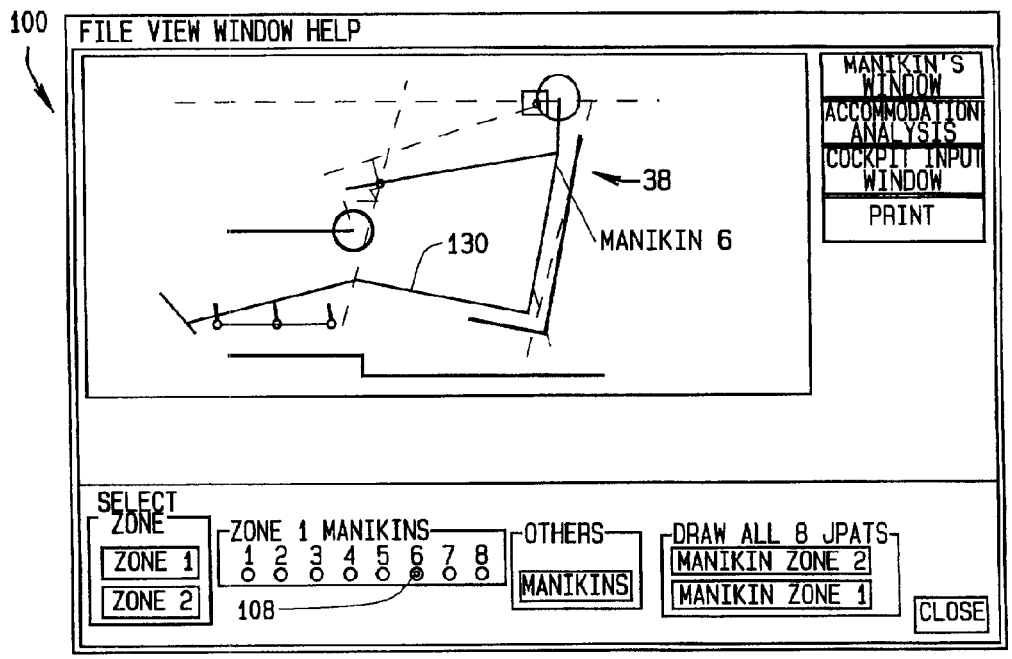
FIG. 6 is an illustration of a draw-cockpit frame in which one manikin is displayed.

FIG. 5 illustrates the draw-cockpit frame 100 after one of the buttons 124 has been activated. The eight sets 80 of manikin dimensions 64 are displayed as manikins 130, all sitting in the cockpit layout 38. Alternatively, as shown in FIG. 6, the user can select one or more of the manikin option buttons 108 to display, as one or more manikins 130, the corresponding manikin dimension sets 80 from the manikin frame 60.

Figure 7:
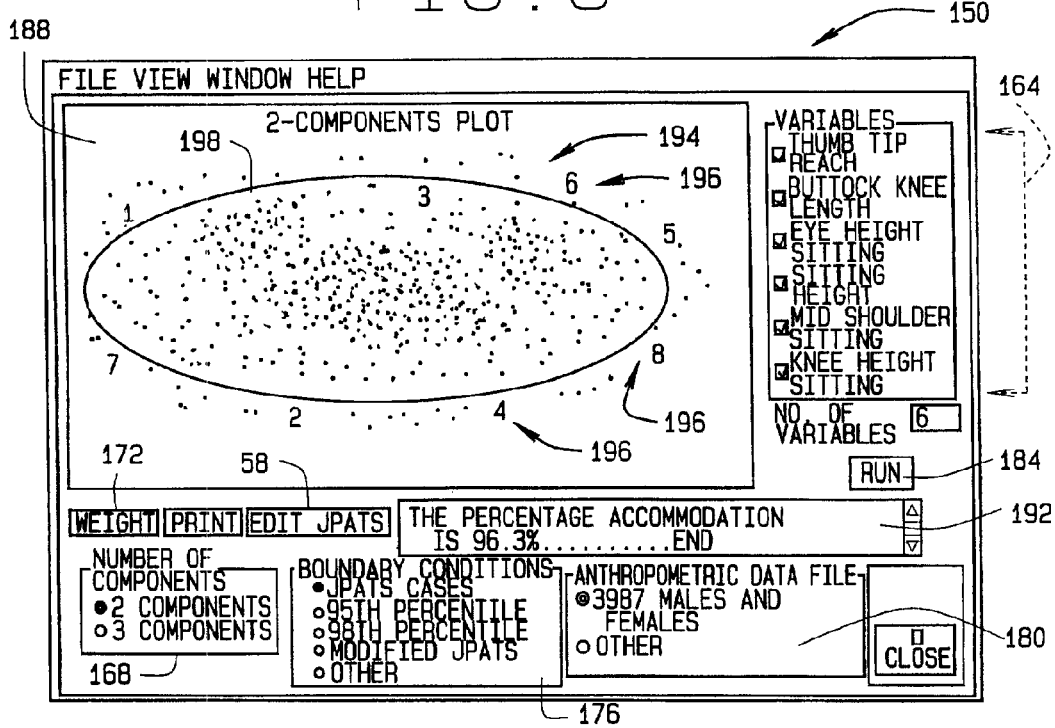
FIG. 7 is an illustration of an accommodation analysis frame.

When a "Calculate Accommodation" button 48 is activated from one of the above-described frames, an accommodation analysis frame 150 is displayed as shown in FIG. 7. Areas on the frame 150 that can be activated by the user include variable check-off boxes 164 corresponding to the body dimensions 64 on the manikin frame 60 (shown in FIG. 3), a "Number of Components" selection box 168, a "Manikin Window" button 58, a "Weight" button 172, a "Boundary Conditions" selection box 176, a database 14 selection box 180 and a run button 184. The frame also includes a component plot window 188 and a percentage accommodation window 192. Displayed in the window 188 are a component plot 194, accommodation limit points 196 and an accommodation ellipse 198. These features shall be further described below.

An exemplary sequence of frames shall now be described to illustrate the operation of the system 10. A user displays the cockpit dimension input frame 34 (shown in FIG. 2) and can enter or modify design dimensions via the dimension blocks 42. The user then activates the "Manikin Window" button 58, and the manikin frame 60 (shown in FIG. 3) is displayed. Eight sets 80 of bodily dimensions 64, which have been predetermined and stored in the processor 20, are displayed in the manikin frame 60. As further described below, the predetermined dimension sets 80 are compiled from the dimension data in the dimension database 14 and represent boundary limits of accommodation. For example, where the data base 14 includes JPATS data as described above, and where it is desired that the cockpit design accommodate a given percentage of the pilot population represented by the JPATS data, the predetermined sets 80 (also referred to herein and in the drawings as "JPATS manikins" and "JPATS cases") can represent boundary limits for the desired percentage as further described below.

Figure 8:
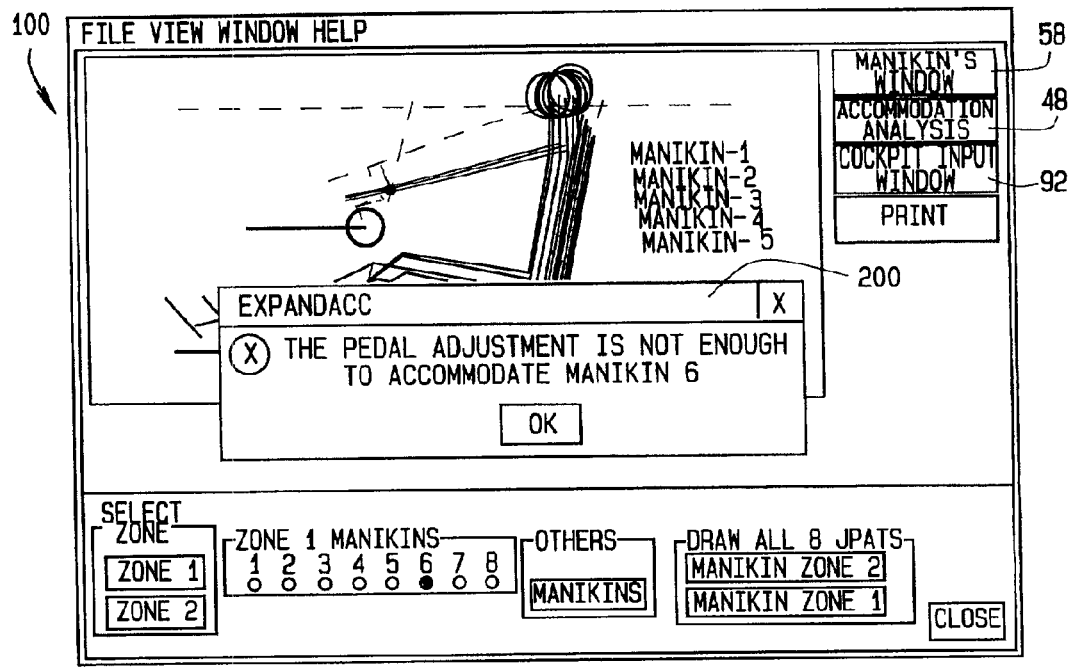
FIG. 8 is an illustration of a draw-cockpit frame in which a warning message is displayed.

If it is desirable to utilize manikins 130 that differ from the predetermined sets 80, the user can modify the dimensions 64 and/or add an "Others" set 88. The user can restore the predetermined sets 80 by activating the "Restore Manikins" button 90 (shown in FIG. 3). When the frame 60 displays dimension data 64 desired by the user, the user can display the manikins 130 in the draw-cockpit frame 100 (shown in FIGS. 4, 5 and 6) by activating button 44. Referring to FIG. 8, if the cockpit design does not accommodate the displayed manikin(s) 130, a warning message 200 is displayed that indicates, for example, where the lack of accommodation occurs in the design and which of the manikin(s) 130 is affected. The user then may activate button 92 to display the cockpit dimension input frame 34 and enter changes to the design dimensions. Alternatively the user can activate button 58 to modify dimensions for the manikins 130 via the manikin frame 60.

The user also alternatively may select button 48 to analyze the design accommodation via the accommodation analysis frame 150 (shown in FIG. 7). For example, if a lack of accommodation could be remedied by altering a portion of the cockpit design, such an alteration might bear implications for other areas of the design, depending on the dimensions of the pilot population desired to be accommodated. Thus a user might wish to investigate whether and how much a particular pilot body dimension affects percentage accommodation, so that the design might be modified without reducing percentage accommodation.

In the present embodiment, by activating the accommodation analysis frame 150, the user can initiate principal component analysis ("PCA") to analyze some or all of the dimensions 64 (shown In FIG. 3). It is contemplated that other statistical methods besides PCA can be used in other embodiments to determine a percentage of accommodation as described herein.

Generally, PCA is a data reduction method that reduces a number of variables to a smaller number of principal components. That is, new linear combinations of p original variables provide d orthogonal (mutually independent) principal components. Each of these principal components explains different amounts of variation contained in a sample space. Each principal component represents an axis of variation that shows no correlation within a population. For example, for any two principal components $PC_i$ and $PC_j$:

$$PC_i = f_{i1}Z_1 + f_{i2}Z_2 + \ldots + f_{ip}Z_p$$

and $PC_j = f_{j1}Z_1 + f_{j2}Z_2 + \ldots + f_{jp}Z_p$ in which $(f_{i1}, f_{i2}, \ldots, f_{ip})$ represent the weights (eigenvectors) of the standardized variables $Z_1, Z_2, \ldots Z_p$ (Z scores) on principal component $PC_i$. The principal components $PC_i$ and $PC_j$ are completely orthogonal where $$Z_p = (X_p - \mu_p)/\sigma_p$$

where $X_p$ represents the pth original variable and $\mu_p$ is the mean and $\sigma_p$ is the standard deviation of the pth original variable. Some principal components represent major axes of variation. Those principal components that account for minimal variation can be discarded. PCA may reveal that some of the original variables are redundancies. Such a variable might be discarded after being considered in a multivariate context such as described herein.

More specifically, when the run button 184 is activated in the accommodation analysis frame 150, data from the body dimension database 14 is analyzed as follows. A mean and standard deviation are computed from the data for each body dimension 64 that has been selected by the user using the variable check-off boxes 164. A Z-score matrix of the data then is computed. A correlation matrix or co-variance matrix of the Z-score matrix is computed, from which are computed eigenvalues and eigenvectors. Principal components are then determined rag from the eigenvectors and Z-scores. Percentile levels of accommodation are determined using confidence levels. The user activates the "Boundary Conditions" selection box 176 to select boundary conditions to be applied to determine percentage accommodation of the data in the database 14. Such boundary conditions can be representative cases (e.g. predetermined manikin 130 dimensions) or a desired percentile limit. The calculated percentage accommodation is displayed in window 192.

Figure 9:
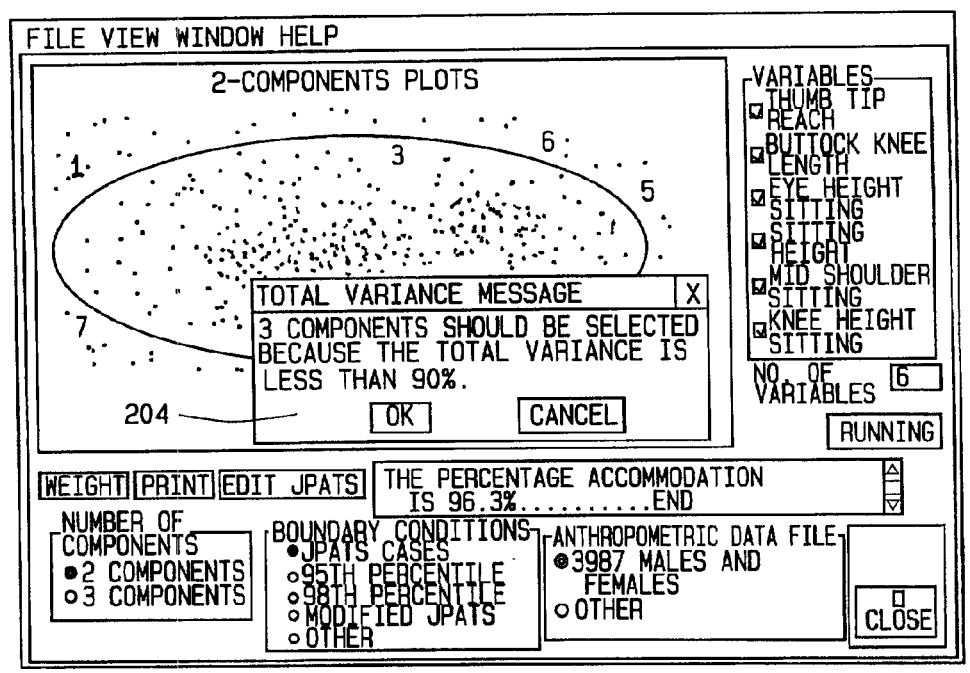
FIG. 9 is an illustration of an accommodation analysis frame in which a warning message is displayed.

Referring to FIG. 7, from the "Number of Components" box 168 the user can select a number of principal components to be determined. Where the user has chosen to determine two principal components, the plot 194 is a two-component plot. A three-component analysis alternatively may be selected, whereupon a three-component plot (not shown) and a percent accommodation ellipsoid (not shown) are displayed. It is contemplated that additional principal components could be determined in other embodiments. In the present preferred embodiment, the processor 20 calculates a total variance in the database 14 data represented by the principal components determined in an analysis. Referring to FIG. 9, if the total variance is less than a predetermined acceptable minimum variance, a warning message 204 is displayed. The user then can run another PCA using additional principal components to increase the total variance.

The boundary conditions applied in the analysis also are displayed in window 188. In the embodiment shown in FIG. 7, JPATS cases have been selected via the box 176 as boundary conditions. The accommodation limit points 196 represent JPATS manikin dimension data, and the ellipse 198 represents an accommodation limit imposed on the data based on the JPATS manikin data. Where a desired percentile limit is applied in the analysis as a boundary condition, the resulting accommodation ellipse 198 (or ellipsoid for three-component analysis) can be utilized to generate manikin data. More specifically, data points lying along such a percentile accommodation ellipse describe limits for those dimensions 64 that contributed to the analysis. The dimension 64 values at such points can be used to generate dimension sets 80 and/or 88 (shown in FIG. 3) that together describe the percentage accommodation derived from the accommodation ellipse 198.

Figure 10:
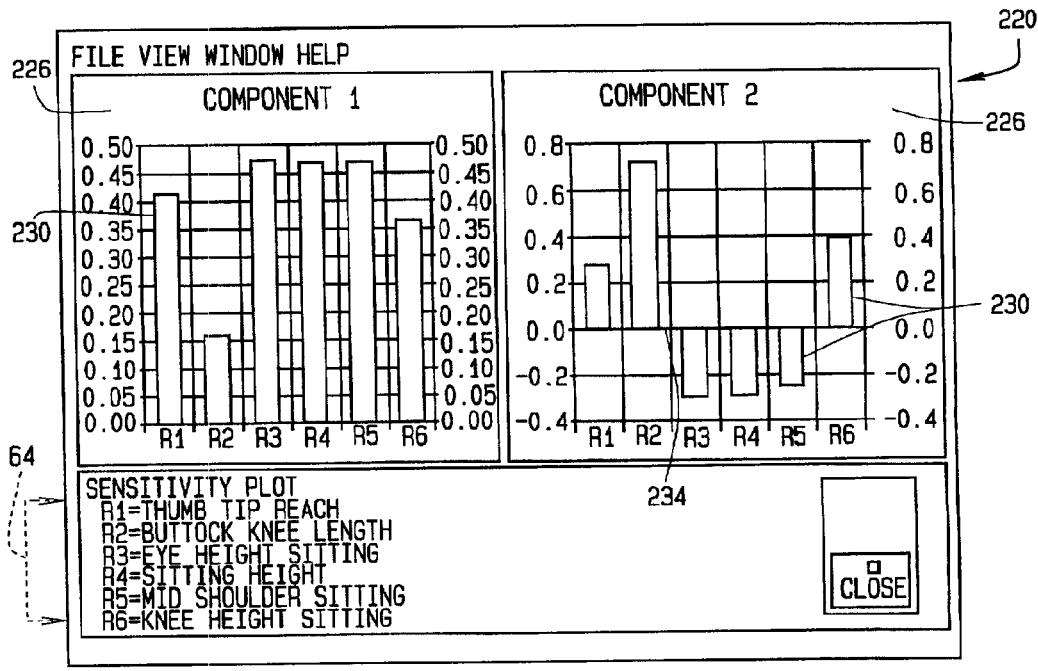
FIG. 10 is an illustration of a sensitivity analysis frame.

By activating the "Weight" button 172 on the accommodation analysis frame 150, the user can display a sensitivity analysis frame indicated generally by reference number 220 in FIG. 10. Sensitivity plots 226 are displayed for each principal component used in the preceding PCA. Each plot 226 depicts weights 230 of the dimensions 64 included in the corresponding principal component. The user can use the plots 226 to determine which of the dimensions 64 are most sensitive, that is, contribute most to the variability of the dimension data in the database 14. Such information assists the user in making changes to the cockpit design dimensions 42 that will not reduce accommodation. Additionally, the user can modify the manikin dimensions 64 based on the weights 230 if it appears that the manikins 130 could be modified to fit into a given cockpit design and nevertheless still reflect a desired percentage of the pilot population.

It is evident that the user can display and interact with the foregoing frames in varying sequences and iterations in order to produce a cockpit design. It is contemplated that the types, numbers and sources of manikin dimensions can differ in other embodiments, as can options for combining user input with existing data from databases such as the database 14. For example, in an embodiment adapted for use in designing an environment for an aircraft maintainer as further described below, body standing and kneeling heights are variables to be considered in the design process.

Figure 11:
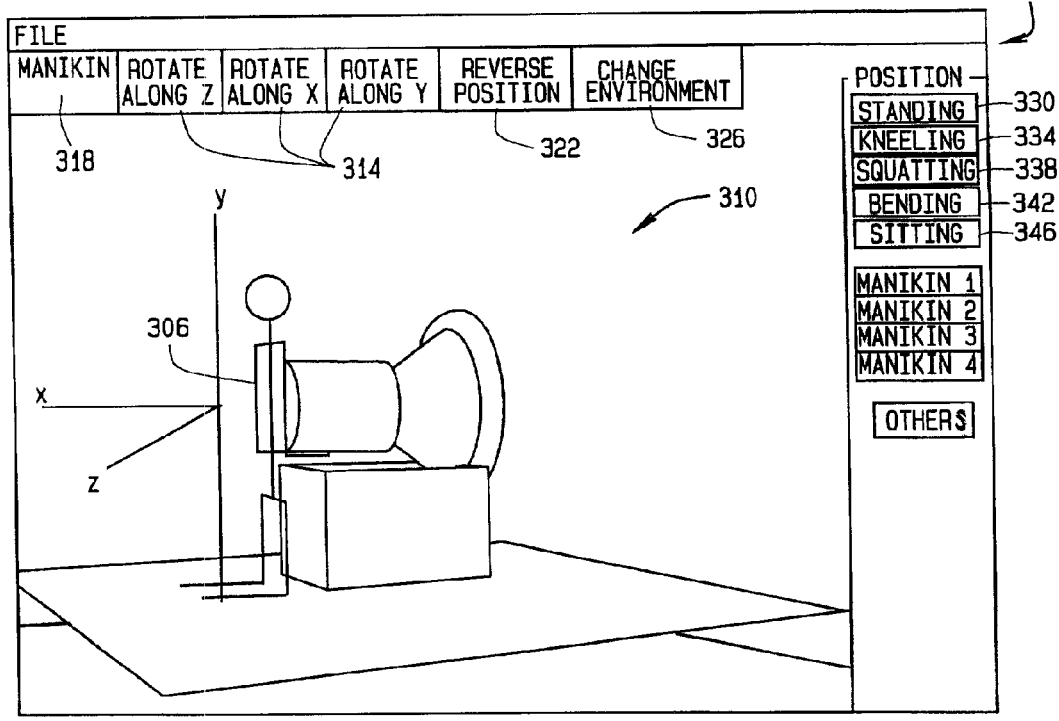
FIG. 11 is an illustration of a frame displaying an aircraft maintainer environment.

A frame displaying an aircraft maintainer environment is indicated generally by reference number 300 in FIG. 11. A manikin 306 is displayed in a kneeling position relative to a work environment 310. Three spatial dimensions (x, y, z) are displayed. Display rotation about axes x, y and/or z can be performed via buttons 314. The frame 300 also can be animated to show, for example, movement of the manikin 306 with respect to the environment 310. A "Manikin" button 318 allows the user to display each of four manikins used as a boundary condition in the maintenance environment. A "Reverse Position" button 322 allows the user to rotate the environment 310 in a counter direction from the rotation buttons 314. For example, if the environment is being rotated along the y-axis in a clockwise direction, activating button 322 will cause rotation counter-clockwise along the y-axis. A "Change Environment" button 326 allows the user to display a frame (not shown) wherein the environment dimensions can be modified. Buttons 330, 334, 338, 342 and 346 allow the user to display one or more manikins in standing, kneeling, squatting, bending and sitting positions respectively.

Another embodiment of a frame for a work environment is indicated generally by reference number 400 in FIG. 12. A manikin 406 is shown standing in an environment 410. A vision cone 414 for the manikin 406 is displayed for assessing visual line of sight. Data 418 describe eye contact with reach position. By activating an Adjust Reach button 420, the user can display a block 422 that allows the user to modify manikin reach dimensions graphically. When a button 426 is activated, an obstacle (not shown in FIG. 12), for example, a box to be lifted, is displayed in the environment 410.

The above-described system can be adapted for use in designing a wide variety of environments, for example, motor vehicle interiors and work and recreation environments. The system provides rapid feedback of information that enables the user to modify dimensions of an environment design to achieve a desired percentage of accommodation. The designer can analyze and compare how a given design accommodates various populations, for example, foreign or exclusively male or female, as well as various multiple side-by-side and forward/aft design configurations. Furthermore, the graphic display allows the designer to demonstrate specific tradeoffs between one design and another relative to accommodation.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A system for developing a design of an environment for accommodating at least one body such as a human body, said system comprising:
   a processor configured to generate a plurality of body models having different dimension sets that together describe a boundary limit for a percentage of a population of bodies potentially to be accommodated by the environment design; and
   a processor-user interface, in which the body models are graphically displayed together relative to an environment design, the interface further configured to accept from a user changes to the environment design and the body models, the processor further configured to modify the design and the body models in accordance with the user changes.

2. The system of claim 1 wherein the processor is further configured to determine whether the modified body models describe a second boundary limit for the same percentage of the population of bodies potentially to be accommodated by the environment design.

3. The system of claim 1 further comprising a body dimension database comprising dimensions of the population of bodies potentially to be accommodated by the environment, the processor configured to generate the body models using the database body dimensions.

4. The system of claim 3 wherein the processor is configured to determine a percentage of the population of bodies potentially to be accommodated by the environment design using principal component analysis on the database body dimensions, and the processor-user interface is further configured to display a plurality of principal components relative to the body models.

5. The system of claim 4 wherein the processor-user interface is further configured to accept a selection by a user of a number of principal components to be used in the principal component analysis.

6. The system of claim 4 wherein the processor-user interface is further configured to accept a selection by a user of boundary conditions to be applied in the principal component analysis.

7. The system of claim 4 wherein the processor is further configured to determine a total variance covered by the principal components, and the processor-user interface is further configured to display a sensitivity plot of weights of the database body dimensions contributing to the principal components.

8. The system of claim 1 wherein the processor is further configured to determine whether at least one of the plurality of body models is accommodated by the environment design, and the processor-user interface is further configured to display a warning when the environment design does not accommodate the at least one body model.

9. The system of claim 1 wherein the processor-user interface is further configured to display dimensions of the body models and to accept from the user changes to the model dimensions.

10. The system of claim 1 wherein the processor-user interface is further configured to display dimensions of the environment design and to accept from the user changes to the design dimensions.

11. The system of claim 1 wherein the processor-user interface is further configured to display the environment design and at least one of the body models in three spatial dimensions.

12. The system of claim 1 wherein the processor-user interface is further configured to display the environment design and at least one of the body models in animation.

13. In combination with a processor, a user-processor interface for designing an environment for accommodating at least one human body, the interface comprising:

a display for displaying an environment design relative to a plurality of body dimension sets which together describe a boundary limit for a percentage of a population of bodies potentially to be accommodated by the environment design, the display configured to display each of the dimension sets as a body model;

the user-processor interface being operable to modify dimensions of the environment design based on analysis of the dimension sets of the body models and to modify the dimension sets of the body models based on dimensions of the environment design.

14. The combination of claim 13 wherein the user-processor interface is further configured to display a percentage of the population that would be accommodated by a given design.

15. The combination of claim 13 wherein the processor is configured to analyze body dimensions of the population using principal component analysis, and wherein the interface is configured to display at least one plot of analysis results.

16. The combination of claim 15 wherein the plot displays the population body dimensions expressed as principal components.

17. The combination of claim 16 wherein the plot describes weights of the body dimensions contributing to the principal components.

18. The combination of claim 17 wherein the user-processor interface is further configured to allow the user to modify dimensions of at least one of the design and the body models based on the weights.

19. A method for developing a design of an environment for accommodating at least one human body, said method comprising the steps of:

selecting a set of body models based on dimensions of a plurality of bodies potentially to be accommodated by the environment;

determining whether an environment design accommodates a desired percentage of the bodies potentially to be accommodated by the environment, said step comprising displaying the body models as a boundary limiting a percentage of the bodies that would be accommodated by the environment design; and modifying the design to accommodate the desired percentage, each of said steps performed by a user interactively with a processor and using a graphical processor-user interface.

20. The method of claim 19 further comprising the step of changing the body models to change the limiting boundary without changing the percentage of the bodies that would be accommodated by the environment design.

21. The method of claim 20 further comprising the step of changing the percentage by altering at least one of the design and the body models.

22. The method of claim 19 further comprising the step of modifying the body models for accommodation by an environment design.

23. The method of claim 19 further comprising the step of modifying at least one of the design and the body models based on principal component analysis of the dimensions of the plurality of bodies.

24. The method of claim 23 wherein the step of modifying at least one of the design and the body models comprises evaluating dimensions based on the dimension weights in the principal component analysis.

* * * * *